United States Patent
Song et al.

(10) Patent No.: US 8,669,545 B2
(45) Date of Patent: Mar. 11, 2014

(54) LIGHT EMITTING DEVICE HAVING SUB BARRIER LAYERS WITH VARYING ENERGY BANDS, LIGHT EMITTING DEVICE PACKAGE AND LIGHTING SYSTEM INCLUDING THE LIGHT EMITTING DEVICE PACKAGE

(75) Inventors: Yong Seon Song, Seoul (KR); Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 4 days.

(21) Appl. No.: 13/367,829

(22) Filed: Feb. 7, 2012

(65) Prior Publication Data

US 2012/0132890 A1 May 31, 2012

(30) Foreign Application Priority Data

Aug. 26, 2011 (KR) .......................... 10-2011-0085987

(51) Int. Cl.
*H01L 29/06* (2006.01)

(52) U.S. Cl.
USPC ................. 257/13; 257/E33.008; 438/20

(58) Field of Classification Search
USPC ................. 257/13, E33.008; 438/20
See application file for complete search history.

(56) References Cited

U.S. PATENT DOCUMENTS

2007/0085097 A1* 4/2007 Kim et al. ........................ 257/94

* cited by examiner

*Primary Examiner* — Jami M Valentine

(74) *Attorney, Agent, or Firm* — Birch, Stewart, Kolasch & Birch, LLP

(57) ABSTRACT

A light emitting device includes an active layer including a quantum barrier and a quantum well, a first conductive type semiconductor layer disposed at one side of the active layer, and a second conductive type semiconductor layer disposed at the other side of the active layer, wherein the first conductive type semiconductor layer or the second conductive type semiconductor layer includes a main barrier layer, and the main barrier layer includes a plurality of sub barrier layers and a basal layer disposed between the plurality of sub barrier layers. The plurality of sub barrier layers includes a first section in which energy band gaps of the plurality of sub barrier layers are increased and a second section in which energy band gaps of the plurality of sub barrier layers are decreased.

21 Claims, 11 Drawing Sheets

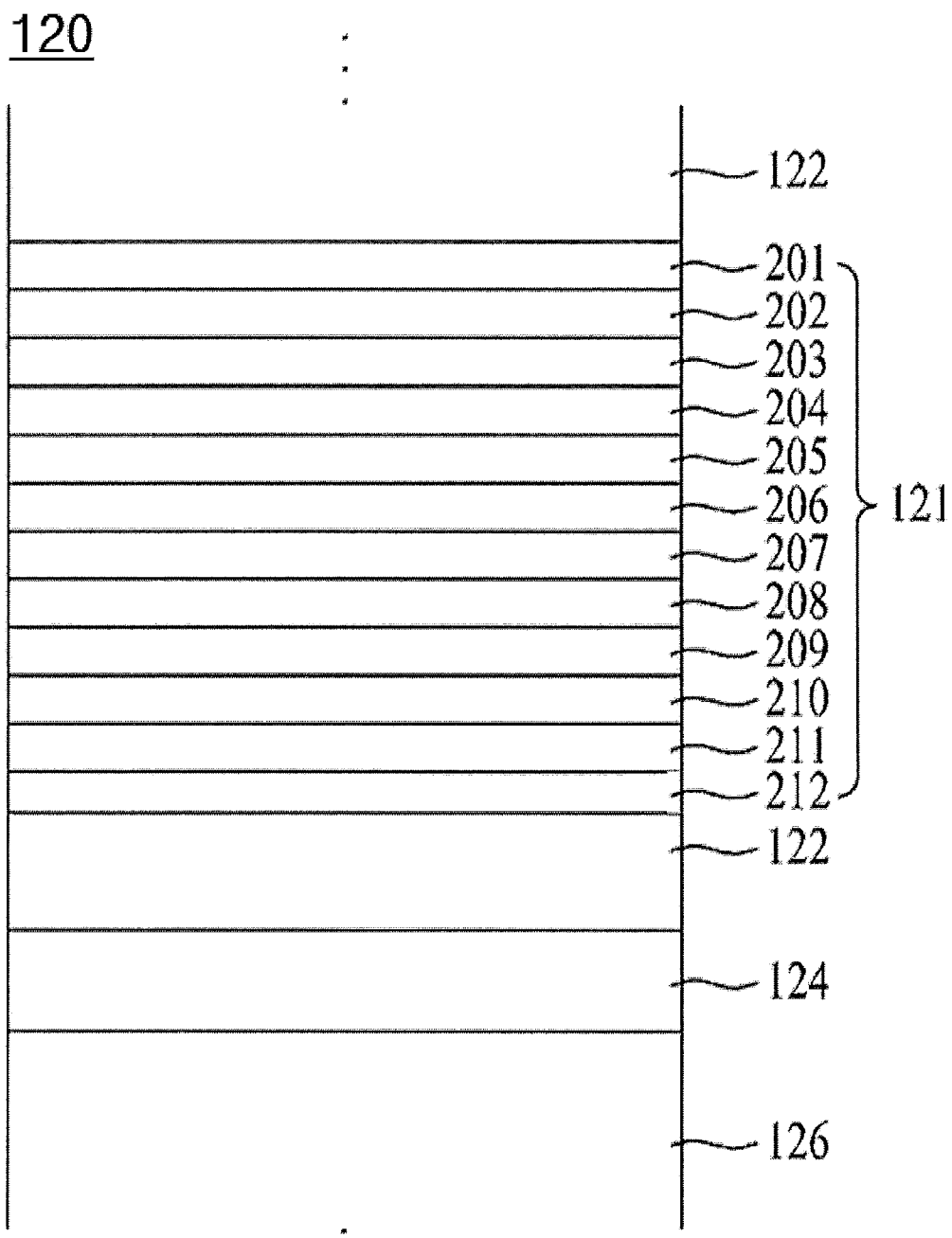

Laser

US 8,669,545 B2

LIGHT EMITTING DEVICE HAVING SUB BARRIER LAYERS WITH VARYING ENERGY BANDS, LIGHT EMITTING DEVICE PACKAGE AND LIGHTING SYSTEM INCLUDING THE LIGHT EMITTING DEVICE PACKAGE

CROSS REFERENCE TO RELATED APPLICATION

This application claims priority under 35 U.S.C. §119 to Korean Patent Application No. 10-2011-0085987, filed in Korea on Aug. 26, 2011, which is hereby incorporated in its entirety by reference as if fully set forth herein.

TECHNICAL FIELD

Embodiments relate to a light emitting device, a light emitting device package and a lighting system including the same.

BACKGROUND

A light emitting device, such as a light emitting diode or a laser diode, using a group III-V or II-VI compound semiconductor material may emit light having various colors, such as red, green, blue and ultraviolet light, as the result of advances in thin film growth technology and materials for the device. Also, the light emitting device may emit white light with high efficiency using phosphor or through combination of colors. Furthermore, the light emitting device has advantages of lower power consumption, semi-permanent lifespan, rapid response time, safety and environmental friendliness, when compared with conventional light sources, such as a fluorescent lamp or an incandescent lamp.

Consequently, application of the light emitting device is expanded to a transmission module of an optical communication apparatus, a light emitting diode backlight that can replace a cold cathode fluorescence lamp constituting the backlight of a liquid crystal display apparatus, a white light emitting diode lighting apparatus which can replace a fluorescent lamp or an incandescent lamp, an automobile head light, and a signal light.

SUMMARY

Embodiments provide a light emitting device that lowers operating voltage and minimizes current leakage, thereby improving light output efficiency, and a light emitting device package and a lighting system including the same.

In one embodiment, a light emitting device includes an active layer including a quantum barrier and a quantum well, a first conductive type semiconductor layer disposed at one side of the active layer, and a second conductive type semiconductor layer disposed at the other side of the active layer, wherein the first conductive type semiconductor layer or the second conductive type semiconductor layer includes a main barrier layer, and the main barrier layer includes a plurality of sub barrier layers and a basal layer disposed between the plurality of sub barrier layers, the plurality of sub barrier layers including a first section in which energy band gaps of the plurality of sub barrier layers are increased and a second section in which energy band gaps of the plurality of sub barrier layers are decreased.

Each of the plurality of sub barrier layers may include a material having an energy band gap greater than that of a material for the first or second conductive type semiconductor layer.

Also, the basal layer may include a material having an energy band gap equal to or less than that of a material for the first or second conductive type semiconductor layer.

Also, the plurality of sub barrier layer may be included in the active layer instead of the first or second conductive type semiconductor layer, disposed between the first conductive type semiconductor layer and the active layer, or disposed between the active layer and the second conductive type semiconductor layer.

For example, each of the plurality of sub barrier layers or the basal layer of the main barrier layer may have a thickness of 0.1 nm to 100 nm.

Also, the basal layer may include a plurality of basal layers, and the plurality of sub barrier layers and the plurality of basal layers may be disposed in pairs. For example, the number of the pairs may be 40 or less. The barrier layer/basal layer pairs may be formed of at least one selected from among AlGaN/GaN, InAlGaN/GaN, AlGaAs/GaAs (InGaAs) and AlGaP/GaP (InGaP).

Also, the barrier layer/basal layer pairs may be formed of AlGaN/GaN, and each of the plurality of sub barrier layers may have a compositional formula of $Al_{x1}Ga_{(1-x1)}N$ ($0 \leq x1 \leq 0.3$). The plurality of sub barrier layers in the first or second section may have different concentrations of Al.

Also, the energy band gaps of the plurality of sub barrier layers in the first section may be increased stepwise, and the energy band gaps of the plurality of sub barrier layers in the second section may be decreased stepwise.

Also, the main barrier layer may include a superlattice structure.

Also, the light emitting device may further include an electron blocking layer between the active layer and the first conductive type semiconductor layer or the second conductive type semiconductor layer.

Also, the energy band gap of each of the plurality of sub barrier layers may be greater than that of the quantum barrier.

BRIEF DESCRIPTION OF THE DRAWINGS

Arrangements and embodiments may be described in detail with reference to the following drawings in which like reference numerals refer to like elements and wherein:

FIG. 4 is a view showing a light emitting structure layer according to an embodiment;

DESCRIPTION OF SPECIFIC EMBODIMENTS

Figure 1:
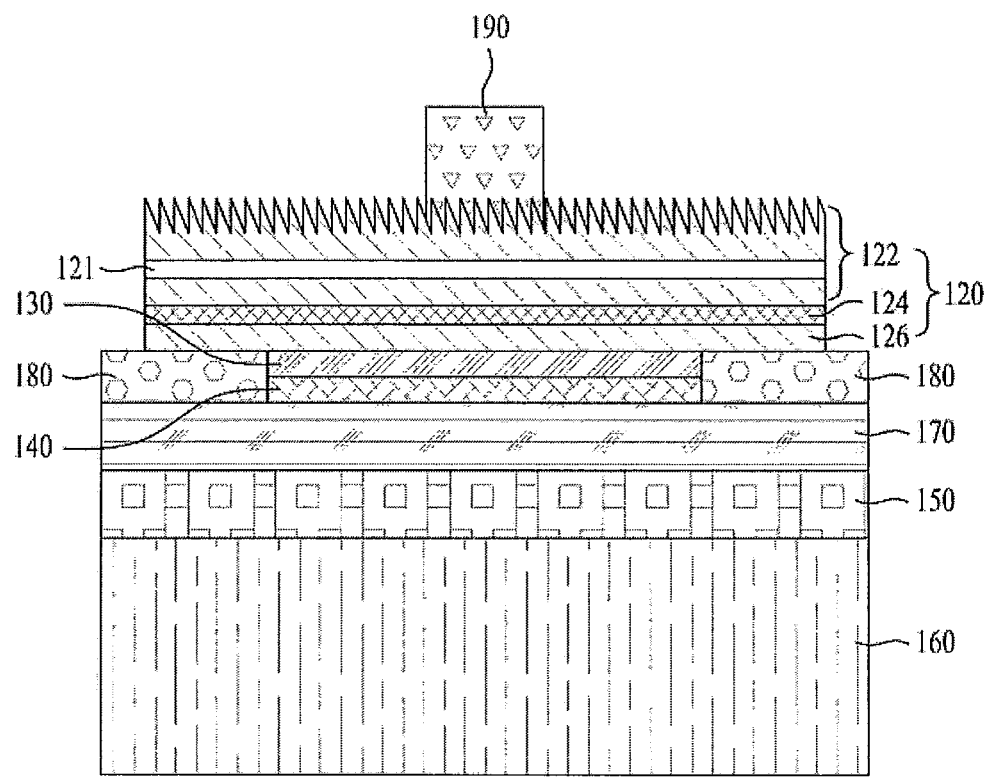
FIG. 1 is a sectional view showing a light emitting device according to an embodiment.

Hereinafter, embodiments will be described with reference to the annexed drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, the sizes of respective layers are exaggerated, omitted, or schematically illustrated for convenience and clarity of description. Further, the sizes of the respective elements do not denote the actual sizes thereof.

FIG. 1 is a sectional view including a light emitting device according to an embodiment. In these embodiments or other embodiments, the light emitting device may be semiconductor light emitting device, for example light emitting diode.

As shown in FIG. 1, the light emitting device may include a combination layer 150 disposed on a support substrate 160, a conductive layer 170 disposed on the combination layer 150, a protective layer 180 disposed on the conductive layer 170, a reflective layer 140 disposed on the conductive layer 170, an ohmic layer 130 disposed on the reflective layer 140, a light emitting structure layer 120 including a first conductive type semiconductor layer 122, an active layer 124, and a second conductive type semiconductor layer 126, and a first electrode 190 disposed on the first conductive type semiconductor layer 122.

The support substrate 160 may be formed of one selected from a group consisting of molybdenum (Mo), silicon (Si), tungsten (W), copper (Cu) and aluminum (Al) or an alloy thereof. Also, the support substrate 160 may selectively include, for example, gold (Au), a copper (Cu) alloy, nickel, copper (Cu)-tungsten (W), or a carrier wafer (for example, GaN, Si, Ge, GaAs, ZnO, SiGe, SiC, SiGe, Ga$_2$O$_3$, etc.) The conductive support substrate 160 may be formed using an electrochemical metal deposition method or a bonding method using a eutectic metal.

The combination layer 150 may be disposed on the support substrate 160. The combination layer 150 may be formed of one selected from a group consisting of, for example, gold (Au), tin (Sn), indium (In), silver (Ag), nickel (Ni), niobium (Nb) and copper (Cu) or an alloy thereof.

The conductive layer 170 may be formed of one selected from a group consisting of nickel (Ni), platinum (Pt), titanium (Ti), tungsten (W), vanadium (V), iron (Fe) and molybdenum (Mo) or an alloy thereof.

The conductive layer 170 minimizes mechanical damage (breakage or peeling) capable of being caused during manufacture of the light emitting device.

The protective layer 180 may include a metallic material and/or an insulative material. A material exhibiting low electrical conductivity than a material for the ohmic layer 130 may be used as the metallic material so that power applied to the ohmic layer 130 is not applied to the protective layer 180.

The protective layer 180 may include at least one selected from among titanium (Ti), nickel (Ni), platinum (Pt), lead (Pb), rhodium (Rh), iridium (Ir), and tungsten (W), at least one selected from among aluminum oxide (Al$_2$O$_3$), silicon oxide (SiO$_2$), silicon nitride (Si$_3$N$_4$) and titanium oxide (TiO$_x$), or at least one selected from among indium tin oxide (ITO), aluminum zinc oxide (AZO) and indium zinc oxide (IZO). On the other hand, the protective layer 180 may include at least one selected from among titanium (Ti), nickel (Ni), platinum (Pt), tungsten (W), molybdenum (Mo), vanadium (V) and iron (Fe).

The protective layer 180 protects the respective components disposed under the protective layer 180 and stably supports the light emitting device during etching of the light emitting structure layer 120, thereby preventing damage to the light emitting device caused during manufacture of the light emitting device.

The reflective layer 140 may be formed of one selected from among Ag, Ni, Al, Rh, Pd, Ir, Ru, Mg, Zn, Pt, Au and Hf or an alloy thereof. The reflective layer 140 may include a single layer or a plurality of layers. For example, the reflective layer 140 formed of aluminum or silver may effectively reflect light emitted from the active layer 124, thereby greatly improving luminous extraction efficiency of the light emitting device.

A transmissive conductive layer and metal may be selectively used to form the ohmic layer 130. The ohmic layer 130 may be formed of at least one selected from among, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrO$_x$, RuO$_x$, NiO, RuO$_x$/ITO, Ni/IrO$_x$/Au, Ni/IrO$_x$/Au/ITO, Ag, Ni, Cr, Ti, Al, Rh, Pd, Ir, Sn, In, Ru, Mg, Zn, Pt, Au and Hf. However, the material for the ohmic layer 130 is not limited thereto. The ohmic layer 130 may be formed using a sputtering method or an electron beam deposition method.

The first conductive type semiconductor layer 122 may be realized as an n type semiconductor layer. The n type semiconductor layer may be formed of a semiconductor material, such as GaN, AlN, AlGaN, InGaN, InN, InAlGaN or AlInN, having a compositional formula of, for example, In$_x$Al$_y$Ga$_{1-x-y}$N (0≤x≤1, 0≤y≤1, 0≤x+y≤1) and may be doped with an n type dopant (for example, Si, Ge, Sn, Se or Te).

According to embodiments, the first conductive type semiconductor layer 122 may include main barrier layer 121.

The main barrier layer 121 may include a plurality of sub barrier layers and basal layers.

Each of the plurality of sub barrier layers is defined as a material layer having an energy band gap greater than that of a material for the first conductive type semiconductor layer 122 or the second conductive type semiconductor layer 126. Each of the basal layers is defined as a material layer having an energy band gap equal to or less than that of a material for the first conductive type semiconductor layer 122 or the second conductive type semiconductor layer 126.

The main barrier layer 121 may include barrier layer/basal layer pairs. According to embodiments, the number of pairs may be varied. For example, the number of pairs may be set to 40 or less. If the number of pairs is increased, the main barrier layer 121 becomes thick with the result that current leakage is decreased but operating voltage becomes high. If the number of pairs is decreased, the main barrier layer 121 becomes thin with the result that operating voltage becomes low but current leakage is increased.

Also, each of the plurality of sub barrier layers may have a thickness through which electrons or holes may be tunneled. For example, the thickness of each of the plurality of sub barrier layers may be set to a predetermined value within a range of 0.1 nm to 100 nm. Also, the thickness of each of the basal layers may be set to a predetermined value within the same range.

According to embodiments, the barrier layer/basal layer pairs may be formed of at least one selected from among AlGaN/GaN, InAlGaN/GaN, AlGaAs/GaAs (InGaAs) and AlGaP/GaP (InGaP); however, the barrier layer/basal layer pairs are not limited thereto.

According to embodiments, the main barrier layer 121 includes a first section in which the energy band gaps of the plurality of sub barrier layers are sequentially increased and a second section in which the energy band gaps of the plurality of sub barrier layers are sequentially decreased. The energy band gaps of the plurality of sub barrier layers constituting the main barrier layer 121 may generally be realized in a parabolic form. For example, the energy band gaps of the plurality of sub barrier layers in the first section may be increased stepwise, and the energy band gaps of the plurality of sub barrier layers in the second section may be decreased stepwise.

The concentration of a material for each of the plurality of sub barrier layers may be adjusted to adjust the energy band gaps of the plurality of sub barrier layers in the main barrier layer 121. For example, if the barrier layer/basal layer pairs are formed of AlGaN/GaN, the concentration of Al constituting the plurality of sub barrier layers may be adjusted to adjust the energy band gap of each of the plurality of sub barrier layers.

If the plurality of sub barrier layers is formed of AlGaN, the composition of Al may be set so that the composition of Al is sequentially increased in the first section and sequentially decreased in the second section within a range of 0 to 30%. If the composition of Al in the plurality of sub barrier layers exceeds 30%, operating voltage may become excessively high.

In this embodiment, therefore, the main barrier layer 121 includes the first section in which the energy band gaps of the plurality of sub barrier layers are sequentially increased and the second section in which the energy band gaps of the plurality of sub barrier layers are sequentially decreased so that the energy band gaps of the plurality of sub barrier layers constituting the main barrier layer 121 are realized in a parabolic form. Consequently, the main barrier layer 121 allows electrons to easily move toward the active layer 124 when a forward bias voltage is applied, and reduces current leakage generated when a reverse bias voltage is applied, thereby reducing or preventing current leakage while preventing the increase of operating voltage.

The active layer 124 disposed under the first conductive type semiconductor layer 122 is a layer for emitting a light having energy decided by an intrinsic energy band of a material for the active layer (light emitting layer) when electrons injected through the first conductive type semiconductor layer 122 contact holes injected through the second conductive type semiconductor layer 126. The active layer 124 may be formed of a group III-V compound semiconductor material. The active layer 124 may be configured to have a single or multi quantum well structure, a quantum wire structure or a quantum dot structure.

If the active layer 124 is configured to have a quantum well structure, the active layer 124 may have a single or quantum well layer structure including a well layer having a compositional formula of $In_xAl_yGa_{1-x-y}N$ ($0 \leq x \leq 1$, $0 \leq y \leq 1$, $0 \leq x+y \leq 1$) and a sub barrier layer having a compositional formula of $In_aAl_bGa_{1-a-b}N$ ($0 \leq a \leq 1$, $0 \leq b \leq 1$, $0 \leq a+b \leq 1$). The well layer may be formed of a material having an energy band gap less than that of the sub barrier layer.

A conductive clad layer may be disposed on and/or under the active layer 124. The conductive clad layer may be formed of an AlGaN semiconductor and may have a band gap greater than that of the active layer 124.

The second conductive type semiconductor layer 126 disposed on the active layer 124 may be realized as a p type semiconductor layer doped with a p type dopant. The p type semiconductor layer may be formed of a semiconductor material, such as GaN, AlN, AlGaN, InGaN, InN, InAlGaN or AlInN, having a compositional formula of $In_xAl_yGa_{1-x-y}N$ ($0 \leq x \leq 1$, $0 \leq y \leq 1$, $0 \leq x+y \leq 1$) and may be doped with a p type dopant (for example, Mg, Zn, Ca, Sr or Ba).

Meanwhile, the light emitting structure layer 120 may include an n type semiconductor layer under the second conductive type semiconductor layer 126. Also, the first conductive type semiconductor layer 122 may be realized as a p type semiconductor layer, and the second conductive type semiconductor layer 126 may be realized as an n type semiconductor layer. Consequently, the light emitting structure layer 120 may include at least one selected from among an N-P junction structure, P-N junction structure, N-P-N junction structure, and P-N-P junction structure.

In this embodiment, the light emitting structure layer 120 includes the n type nitride semiconductor layer doped with the n type dopant, the active layer disposed on the n type nitride semiconductor layer, and the p type nitride semiconductor layer, disposed on the active layer and doped with the p type dopant. However, the light emitting structure layer 120 is not limited thereto. The light emitting structure layer 120 may be formed of various materials and may have various stack structures.

An irregular portion may be formed on the first conductive type semiconductor layer 122 to improve luminous extraction efficiency. The irregular portion may be formed by dry etching, photo chemical wet etching (PEC) or etching using a mask. Plasma etching, sputter etching or ion etching may be used as the dry etching.

For example, the irregular portion may be formed by dry etching using BCl or $Cl_2$. Dry etching may reduce the thickness of the first conductive type semiconductor layer 122 as compared with PEC.

The irregular portion varies an incidence angle of light emitted from the active layer 124 and incident upon the first conductive type semiconductor layer 122 to reduce total reflection at the surface of the first conductive type semiconductor layer 122, thereby improving luminous extraction efficiency, and to reduce absorption of the light emitted from the active layer 124 into the light emitting structure layer, thereby improving light emission efficiency.

According to embodiments, the irregular portion may be formed periodically or non-periodically. The shape of the irregular portion is not limited. For example, the irregular portion may be formed in single or complex shapes, such as a quadrangular shape, hemispherical shape, triangular shape, and trapezoidal shape.

The irregular portion may be formed by wet etching or dry etching.

Plasma etching, sputter etching or ion etching may be used as the dry etching. PEC may be used as the wet etching.

In PEC, etching speed difference based on the amount of an etching solution (for example, KOH) and crystallinity of GaN may be adjusted to adjust the shape of the irregular portion. Also, etching may be carried out after a mask is formed to periodically adjust the shape of the irregular portion.

The first electrode 190 is disposed on the first conductive type semiconductor layer 122. The first electrode 190 may be formed of one selected from among molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy thereof. The first electrode 190 may include a single layer or a plurality of layers.

Figure 2:
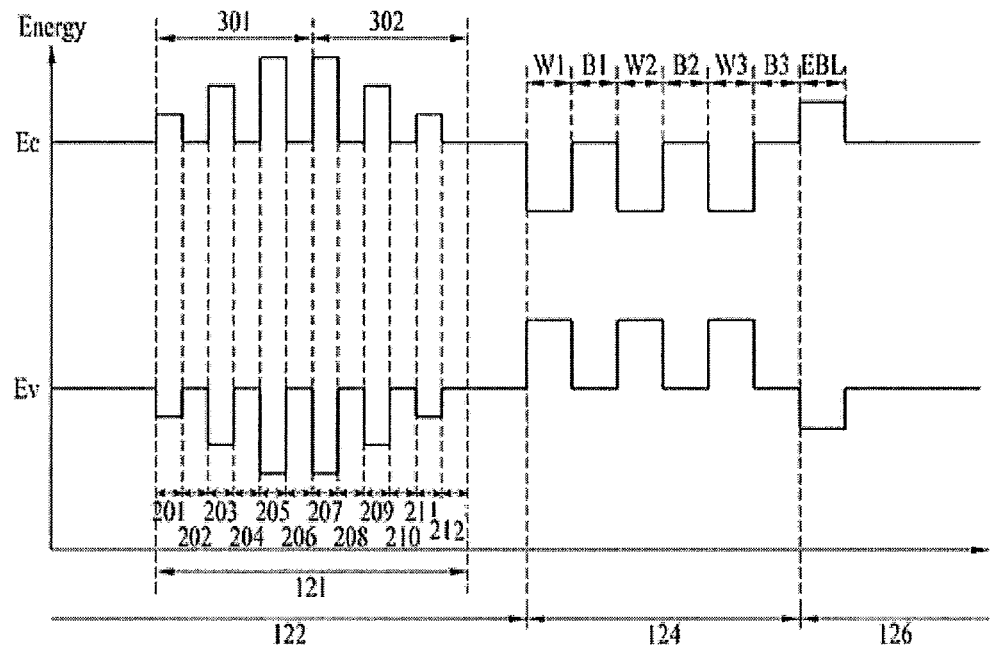
FIG. 2 is a view showing an example of an energy band diagram of the light emitting device.

FIG. 2 is a view showing an example of an energy band diagram of the light emitting device.

Referring to FIG. 2, the first conductive type semiconductor layer 122 includes the main barrier layer 121, which reduces current leakage generated when the reverse bias voltage is applied.

If the thickness of the main barrier layer 121 is increased or the energy band gap of the main barrier layer 121 is increased, the effect of the barrier to reduce current leakage generated when the reverse bias voltage is applied is improved.

However, if the thickness of the main barrier layer 121 is increased or the energy band gap of the main barrier layer 121 is increased, movement of electrons is difficult in the first conductive type semiconductor layer 122 with the result that operating voltage becomes high.

In this embodiment, therefore, the main barrier layer 121 includes a first section 301 in which the energy band gaps of the plurality of sub barrier layers constituting the main barrier layer 121 are sequentially increased and a second section 302 in which the energy band gaps of the plurality of sub barrier layers are sequentially decreased so that the energy band gaps of the plurality of sub barrier layers constituting the main barrier layer 121 are realized in a parabolic form. The energy band gaps of the plurality of sub barrier layers 201, 203 and 205 in the first section may be increased stepwise, and the energy band gaps of the plurality of sub barrier layers 207, 209 and 211 in the second section may be decreased stepwise.

For example, the main barrier layer 121 may include the plurality of sub barrier layers 201, 203, 205, 207, 209 and 211 and basal layers 202, 204, 206, 208, 210 and 212.

The main barrier layer 121 may include barrier layer/basal layer pairs. According to embodiments, the number of pairs may be varied.

Each of the plurality of sub barrier layers is defined as a material layer having an energy band gap greater than that of a material for the first conductive type semiconductor layer 122 or the second conductive type semiconductor layer 126. Each of the basal layers is defined as a material layer having an energy band gap equal to or less than that of a material for the first conductive type semiconductor layer 122 or the second conductive type semiconductor layer 126.

For example, the barrier layer/basal layer pairs may be formed of at least one selected from among AlGaN/GaN, AlGaN/InGaN, InAlGaN/GaN, AlGaAs/GaAs (InGaAs) and AlGaP/GaP (InGaP); however, the barrier layer/basal layer pairs are not limited thereto.

According to embodiments, the number of barrier layer/basal layer pairs of the main barrier layer 121 may be varied. For example, the number of pairs may be set to 40 or less. If the number of pairs is increased, the main barrier layer 121 becomes thick with the result that current leakage is decreased but operating voltage becomes high. If the number of pairs is decreased, the main barrier layer 121 becomes thin with the result that operating voltage becomes low but current leakage is increased.

Also, each of the plurality of sub barrier layers may have a thickness through which electrons or holes may be tunneled. For example, the thickness of each of the plurality of sub barrier layers may be set to a predetermined value within a range of 0.1 nm to 100 nm. Also, the thickness of each of the basal layers may be set to a predetermined value within the same range.

The energy band gaps of the plurality of sub barrier layers 201, 203 and 205 in the first section 301 of the main barrier layer 121 may be sequentially increased, and the energy band gaps of the plurality of sub barrier layers 207, 209 and 211 in the second section 302 of the main barrier layer 121 may be sequentially decreased.

For example, if the barrier layer/basal layer pairs are formed of AlGaN/GaN, the concentration of Al constituting the plurality of sub barrier layers may be adjusted to adjust the energy band gap of each of the plurality of sub barrier layers.

If the plurality of sub barrier layers is formed of AlGaN, the composition of Al may be set so that the composition of Al is sequentially increased in the first section 201, 203, 205 and sequentially decreased in the second section 207, 209, 211 within a range of 0 to 30%. If the composition of Al in the plurality of sub barrier layers exceeds 30%, operating voltage may become excessively high.

In this embodiment, therefore, the main barrier layer 121 includes the first section 301 in which the energy band gaps of the plurality of sub barrier layers are sequentially increased and the second section 302 in which the energy band gaps of the plurality of sub barrier layers are sequentially decreased so that the energy band gaps of the plurality of sub barrier layers constituting the main barrier layer 121 are realized in a parabolic form. Consequently, the main barrier layer 121 allows electrons to easily move toward the active layer 124 when the forward bias voltage is applied, and reduces current leakage generated when the reverse bias voltage is applied, thereby preventing current leakage while preventing increase in operating voltage.

Consequently, the energy band gaps of the plurality of sub barrier layers in the first section 301 and the second section 302 may generally have a parabolic form.

Also, according to embodiments, the number of the main barrier layer 121, each of which includes a first section 301 and a second section 302, may be plural.

Referring to FIG. 2, the active layer 124 may have a multi quantum well structure including a plurality of quantum wells W1, W2 and W3 and a plurality of quantum barriers B1, B2 and B3.

Also, according to embodiments, the second conductive type semiconductor layer 126 may include an electron blocking layer (EBL) to block electrons discharged from the active layer 124.

According to embodiments, the EBL may be realized as the above main barrier layer 121; however, the EBL is not limited thereto.

Figure 3:
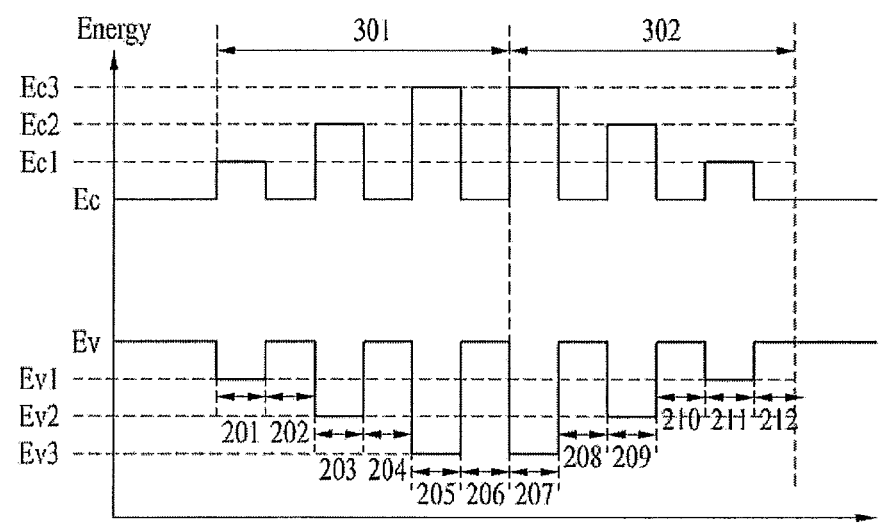
FIG. 3 is a view showing an energy band diagram of a main barrier layer of the light emitting device according to an embodiment.

FIG. 3 is a view showing an energy band diagram of the main barrier layer of the light emitting device, according to an embodiment.

Referring to FIG. 3, the main barrier layer of the light emitting device may include a plurality of sub barrier layers 201, 203, 205, 207, 209 and 211 and basal layers 202, 204, 206, 208, 210 and 212.

The main barrier layer 121 may include barrier layer/basal layer pairs. According to embodiments, the number of pairs may be varied.

The main layer 121 of the light emitting device may include a first section 301 in which the energy band gaps of the plurality of sub barrier layers constituting the main barrier layer 121 are sequentially increased and a second section 302 in which the energy band gaps of the plurality of sub barrier layers are sequentially decreased so that the energy band gaps of the plurality of sub barrier layers constituting the main barrier layer 121 are realized in a parabolic form.

For example, the energy band gaps of the first sub barrier layer 201, the second sub barrier layer 203, and the third sub barrier layer 205 in the first section 301 may be sequentially increased, and the energy band gaps of the fourth sub barrier layer 207, the fifth sub barrier layer 209, and the sixth sub barrier layer 211 in the second section 302 may be sequentially decreased.

In this case, the energy band gaps of the plurality of sub barrier layers 201, 203 and 205 in the first section 301 may be increased stepwise, and the energy band gaps of the plurality of sub barrier layers 207, 209 and 211 in the second section 302 may be decreased stepwise.

If the plurality of sub barrier layers is formed of AlGaN, the composition of Al may be set so that the composition of Al is sequentially increased in the first section 201, 203, 205 and sequentially decreased in the second section 207, 209, 211 within a range of 0 to 30%. If the composition of Al in the plurality of sub barrier layers exceeds 30%, operating voltage may become excessively high.

In this case, compositional formulas of the first sub barrier layer 201 and the sixth sub barrier layer 211 may be set to $Al_{x1}Ga_{(1-x1)}N$ (0≤x1≤0.3), compositional formulas of the second sub barrier layer 203 and the fifth sub barrier layer 209 may be set to $Al_{x2}Ga_{(1-x2)}N$ (0≤x2≤1.3), and compositional formulas of the third sub barrier layer 205 and the fourth sub barrier layer 207 may be set to $Al_{x3}Ga_{(1-x3)}N$ (0≤x3≤0.3). Here, x1, x2 and x3 may be set so that x1<x2<x3.

Also, the basal layers 202, 204, 206, 208, 210 and 212 may be formed of GaN or InGaN.

FIG. 4 is a view showing a light emitting structure layer 120 according to an embodiment.

Referring to FIG. 4, the light emitting structure layer 120 may include a first conductive type semiconductor layer 122, an active layer 124, and a second conductive type semiconductor layer 126. The first conductive type semiconductor layer 122 may include main barrier layer 121. The main barrier layer 121 may include plurality of sub barrier layers 201, 203, 205, 207, 209 and 211 and basal layers 202, 204, 206, 208, 210 and 212.

For example, compositional formulas of the first sub barrier layer 201 and the sixth sub barrier layer 211 may be set to $Al_{x1}Ga_{(1-x1)}N$ (0≤x1≤0.3), compositional formulas of the second sub barrier layer 203 and the fifth sub barrier layer 209 may be set to $Al_{x2}Ga_{(1-x2)}N$ (0≤x2≤1.3), and compositional formulas of the third sub barrier layer 205 and the fourth sub barrier layer 207 may be set to $Al_{x3}Ga_{(1-x3)}N$ (0≤x3≤0.3). Here, x1, x2 and x3 may be set so that x1<x2<x3. Also, the basal layers 202, 204, 206, 208, 210 and 212 may be formed of GaN or InGaN.

The plurality of sub barrier layers and the basal layers have the same construction as those described in detail with reference to FIGS. 1 to 3.

In the light emitting device according to this embodiment, therefore, the main barrier layer 121 allows electrons to easily move toward the active layer 124 when the forward bias voltage is applied, and reduces current leakage generated when the reverse bias voltage is applied, thereby preventing current leakage while preventing the increase of operating voltage.

In the above description, the main barrier layer 121 is included in the first conductive type semiconductor layer 122. According to other embodiments, the main barrier layer 121 may be disposed between the first conductive type semiconductor layer 122 and the active layer 124, included in the active layer 124, included in the second conductive type semiconductor layer 126, or disposed between the active layer 124 and the second conductive type semiconductor layer 126. However, disposition of the main barrier layer 121 is not limited thereto.

FIGS. 5A to 5H are views showing a method of manufacturing a light emitting device according to an embodiment.

Figure 5A:
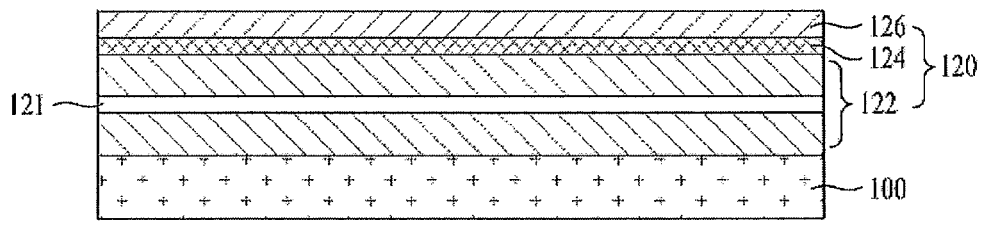
FIGS. 5A to 5H are views showing a method of manufacturing a light emitting device according to an embodiment.

As shown in FIG. 5A, a substrate 100 is prepared. The substrate 100 may be a conductive substrate or insulative substrate. For example, the substrate 100 may be formed of at least one selected from among sapphire ($Al_2O_3$), SiC, Si, GaAs, GaN, ZnO, Si, GaP, InP, Ge and $Ga_2O_3$. An irregular portion may be formed on the substrate 100; however, the construction is not limited thereto. The substrate 100 may be wet etched to remove impurities from the surface of the substrate 100.

A light emitting structure layer 120, including a first conductive type semiconductor layer 122, an active layer 124 and a second conductive type semiconductor layer 126, may be formed on the substrate 100.

At this time, a buffer layer (not shown) may be grown between the light emitting structure layer 120 and the substrate 100. The buffer layer functions to reduce lattice mismatch and difference in coefficient of thermal expansion. The buffer layer may be formed of a group III-V compound semiconductor material, for example at least one selected from among GaN, InN, AlN, InGaN, AlGaN, InAlGaN and AlInN. An undoped semiconductor layer may be formed on the buffer layer. However, the construction is not limited thereto.

Also, the light emitting structure layer 120 may be formed by metal organic chemical vapor deposition (MOCVD), chemical vapor deposition (CVD), plasma-enhanced chemical vapor deposition (PECVD), molecular beam epitaxy (MBE) or hydride vapor phase epitaxy (HVPE). However, the method of forming the light emitting structure layer 120 is not limited thereto.

The first conductive type semiconductor layer 122 may be realized as a group III-V compound semiconductor doped with a first conductive type dopant. If the first conductive type semiconductor layer 122 is an n type semiconductor layer, the first conductive type dopant may include, for example, Si, Ge, Sn, Se or Te as an n dopant. However, the first conductive type dopant is not limited thereto.

The first conductive type semiconductor layer 122 may include a semiconductor material having a compositional formula of $Al_xIn_yGa_{(1-x-y)}N$ (0≤x≤1, 0≤y≤1, 0≤x+y≤1). For example, the first conductive type semiconductor layer 122 may be formed of at least one selected from among GaN, InN, AlN, InGaN, AlGaN, InAlGaN, AlInN, AlGaAs, InGaAs, AlInGaAs, GaP, AlGaP, InGaP, AlInGaP and InP.

The first conductive type semiconductor layer 122 may be formed by injecting silane ($SiH_4$) gas including an n type dopant such as silicon (Si), trimethylgallium (TMGa) gas, ammonia ($NH_3$) gas, or nitrogen ($N_2$) gas, into a chamber.

Also, the first conductive type semiconductor layer 122 may include main barrier layer 121. The main barrier layer 121 may include a plurality of sub barrier layers and basal layers.

The main barrier layer 121 may include barrier layer/basal layer pairs. According to embodiments, the number of pairs may be varied.

Aforementioned, each of the plurality of sub barrier layers is defined as a material layer having an energy band gap greater than that of a material for the first conductive type semiconductor layer 122 or the second conductive type semiconductor layer 126. Each of the basal layers is defined as a material layer having an energy band gap equal to or less than that of a material for the first conductive type semiconductor layer 122 or the second conductive type semiconductor layer 126.

For example, the barrier layer/basal layer pairs may be formed of at least one selected from among AlGaN/GaN, InAlGaN/GaN, AlGaAs/GaAs(InGaAs) and AlGaP/GaP(InGaP); however, the barrier layer/basal layer pairs are not limited thereto.

The energy band gaps of the plurality of sub barrier layers 201, 203 and 205 in a first section of the main barrier layer 121 may be sequentially increased, and the energy band gaps of the plurality of sub barrier layers 207, 209 and 211 in a second section of the main barrier layer 121 may be sequentially decreased. For example, the energy band gaps of the plurality of sub barrier layers 201, 203 and 205 in the first section may be increased stepwise, and the energy band gaps of the plurality of sub barrier layers 207, 209 and 211 in the second section may be decreased stepwise.

For example, if the barrier layer/basal layer pairs are formed of AlGaN/GaN, the concentration of Al constituting the plurality of sub barrier layers may be adjusted to adjust the energy band gap of each of the plurality of sub barrier layers.

Consequently, the energy band gaps of the plurality of sub barrier layers in the first section and the second section may generally have a parabolic form.

According to embodiments, the number of barrier layer/basal layer pairs may be varied. For example, the number of pairs may be set to 40 or less.

If the number of pairs is increased, the main barrier layer 121 becomes thick with the result that current leakage is decreased but operating voltage becomes high. If the number of pairs is decreased, the main barrier layer 121 becomes thin with the result that operating voltage becomes low but current leakage is increased.

Also, each of the plurality of sub barrier layers may have a thickness through which electrons or holes may be tunneled. For example, the thickness of each of the plurality of sub barrier layers may be set to a predetermined value within a range of 0.1 nm to 100 nm. Also, the thickness of each of the basal layers may be set to a predetermined value within the same range.

In this embodiment, therefore, the main barrier layer 121 includes the first section in which the energy band gaps of the plurality of sub barrier layers are sequentially increased and the second section in which the energy band gaps of the plurality of sub barrier layers are sequentially decreased so that the energy band gaps of the plurality of sub barrier layers constituting the main barrier layer 121 are realized in a parabolic form. Consequently, the main barrier layer 121 reliably functions as a barrier to block holes injected from the active layer 124. Also, the main barrier layer 121 allows electrons, injected from the first conductive type semiconductor layer 122 into the active layer 124, to easily pass therethrough, thereby preventing current leakage while preventing the increase of operating voltage.

The active layer 124 is a layer for emitting a light having energy decided by an intrinsic energy band of a material for the active layer (light emitting layer) when carriers injected through the first conductive type semiconductor layer 122 and carriers injected through the second conductive type semiconductor layer 126 come across.

The active layer 124 may be configured to have at least one selected from among a single quantum well structure, a multi quantum well (MQW) structure, a quantum wire structure and a quantum dot structure. For example, trimethylgallium (TMGa) gas, ammonia ($NH_3$) gas, nitrogen ($N_2$) gas or trimethylindium (TMIn) gas may be injected so that the active layer 124 has a multi quantum well structure; however, the construction of the active layer 124 is not limited thereto.

The well layer/barrier layer pairs of the active layer 124 may be formed of at least one selected from among InGaN/GaN, InGaN/InGaN, GaN/AlGaN, InAlGaN/GaN, GaAs (InGaAs)/AlGaAs and GaP (InGaP)/AlGaP; however, the well layer/barrier layer pairs are not limited thereto. Each of the well layers may be formed of a material having a band gap narrower than that of each of the sub barrier layers.

A conductive clad layer (not shown) may be formed on and/or under the active layer 124. The conductive clad layer may be formed of an AlGaN semiconductor and may have a band gap greater than that of the active layer 124.

The second conductive type semiconductor layer 126 may include a group III-V compound semiconductor material doped with a second conductive type dopant, such as a semiconductor material having a compositional formula of $In_xAl_yGa_{1-x-y}N$ ($0 \le x \le 1$, $0 \le y \le 1$, $0 \le x+y \le 1$). If the second conductive type semiconductor layer 126 is a p type semiconductor layer, the second conductive type dopant may include, for example, Mg, Zn, Ca, Sr or Ba as a p dopant.

The second conductive type semiconductor layer 126 may be formed as a p type GaN layer by injecting Bis-ethylcyclopentadienyl magnesium ($EtCp_2Mg$) {Mg ($C_2H_5C_5H_4$)$_2$} including a p type dopant such as magnesium (Mg), trimethylgallium (TMGa) gas, ammonia ($NH_3$) gas, or nitrogen ($N_2$) gas, into a chamber. However, the second conductive type semiconductor layer 126 is not limited thereto.

In this embodiment, the first conductive type semiconductor layer 122 may be realized as a p type semiconductor layer, and the second conductive type semiconductor layer 126 may be realized as an n type semiconductor layer. Also, a semiconductor layer having a polarity opposite to that of the second conductive type semiconductor layer 126 may be formed on the second conductive type semiconductor layer 126. For example, an n type semiconductor layer (not shown) may be formed on the second conductive type semiconductor layer 126 if the second conductive type semiconductor layer 126 is a p type semiconductor layer. Consequently, the light emitting structure layer 120 may include one selected from among an N-P junction structure, P-N junction structure, N-P-N junction structure, and P-N-P junction structure.

Figure 5B:
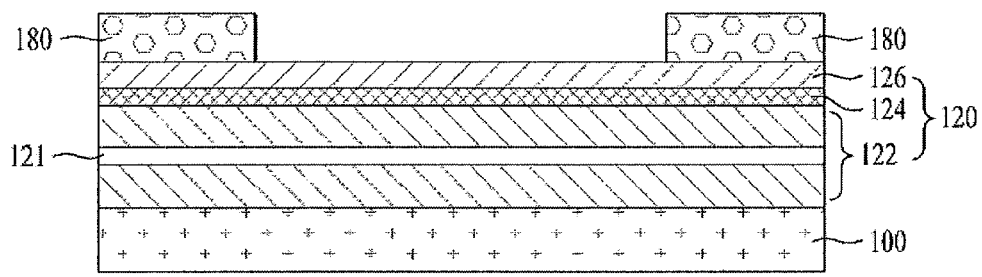

Subsequently, as shown in FIG. 5B, a protective layer 180 is stacked on the second conductive type semiconductor layer 126. The protective layer 180 may be formed of an insulative material, such as a nonconductive oxide or nitride. For example, the protective layer 180 may be formed of silicon oxide ($SiO_2$), silicon nitride ($Si_3N_4$), titanium oxide ($TiO_x$) or aluminum oxide ($Al_2O_3$). The protective layer 180 prevents the components disposed under the protective layer 180 from being etched and stably supports the light emitting device during etching of a light emitting structure layer 120, which will be described below, thereby preventing damage to the light emitting device caused during manufacture of the light emitting device.

The protective layer 180 is etched to form a groove. The groove may be formed by dry etching using a mask.

Figure 5C:
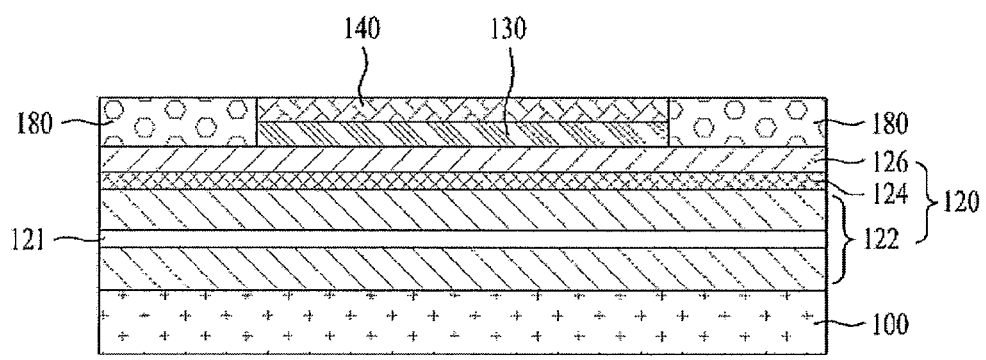

Subsequently, as shown in FIG. 5C, an ohmic layer 130 and a reflective layer 140 are stacked on the second conductive type semiconductor layer 126 positioned in the groove.

The ohmic layer 130 may be stacked to a thickness of about 200 Å. A transmissive conductive layer and metal may be selectively used to form the ohmic layer 130. The ohmic layer 130 may be formed of at least one selected from among, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au and Hf. However, the material for the ohmic layer 130 is not limited thereto. The ohmic layer 130 may be formed using a sputtering method or an electron beam deposition method.

A reflective layer 140 may be formed on the ohmic layer 130 so that the reflective layer 140 has a thickness of about 2500 Å. The reflective layer 140 may be formed of at least one selected from among, for example, Ag, Ni, Al, Rh, Pd, Ir, Ru, Mg, Zn, Pt, Au and Hf or an alloy thereof. Alternatively, the metal or alloy thereof, and a transmissive conductive material, such as ITO, IZO, IZTO, IAZO, IGZO, IGTO, AZO or ATO, may be used so that the reflective layer 140 includes a plurality of layers. Specifically, IZO/Ni, AZO/Ag, IZO/Ag/Ni, AZO/Ag/Ni, Ag/Cu, Ag/Pd/Cu may be stacked. Aluminum or silver may effectively reflect light emitted from the active layer 124, thereby greatly improving luminous extraction efficiency of the light emitting device.

Figure 5D:
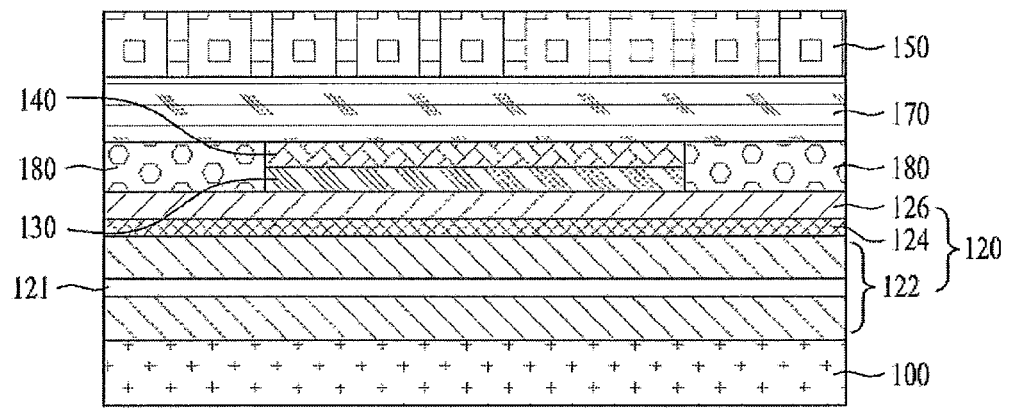

Subsequently, as shown in FIG. 5D, a conductive layer 170 is formed on the reflective layer 140. The conductive layer 170 may be formed of one selected from a group consisting of nickel (Ni), platinum (Pt), titanium (Ti), tungsten (W), vanadium (V), iron (Fe) and molybdenum (Mo) or an alloy thereof.

At this time, the conductive layer 170 may be formed using a sputtering deposition method. When the sputtering deposition method is used, ionized atoms are accelerated by an electric field and are collided with a source material of the conductive layer 170 with the result that atoms are discharged from the source material and are deposited. Also, according to embodiments, an electrochemical metal deposition method or a bonding method using a eutectic metal may be used. According to embodiments, the conductive layer 170 includes a plurality of layers.

The conductive layer 170 supports the light emitting structure layer 120, thereby minimizing mechanical damage (breakage or peeling) caused during manufacture of the light emitting device.

A combination layer 150 to combine the conductive layer 170 and a support substrate 160 may be formed on the conductive layer 170. The combination layer 150 may be formed of one selected from a group consisting of, for example, gold (Au), tin (Sn), indium (In), silver (Ag), nickel (Ni), niobium (Nb) and copper (Cu) or an alloy thereof.

Figure 5E:
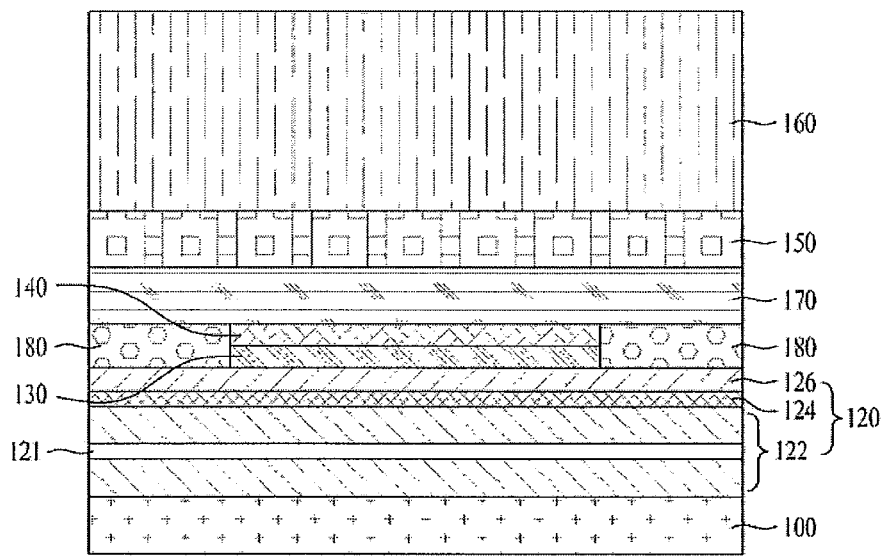

Subsequently, as shown in FIG. 5E, a support substrate 160 may be formed on the combination layer 150.

The support substrate 160 may be formed of one selected from a group consisting of molybdenum (Mo), silicon (Si), tungsten (W), copper (Cu) and aluminum (Al) or an alloy thereof. Also, the support substrate 160 may selectively include, for example, gold (Au), a copper (Cu) alloy, nickel, copper (Cu)-tungsten (W), or a carrier wafer (for example, GaN, Si, Ge, GaAs, ZnO, SiGe, SiC, SiGe, $Ga_2O_3$, etc.) The conductive support substrate 160 may be formed using an electrochemical metal deposition method or a bonding method using a eutectic metal.

According to embodiments, if holes are injected into the second conductive type semiconductor layer 126 via the conductive layer 170, the support substrate 160 may be formed of an insulative material, such as a nonconductive oxide or nitride. For example, the support substrate 160 may be formed of silicon oxide ($SiO_2$), silicon nitride or aluminum oxide.

Figure 5F:
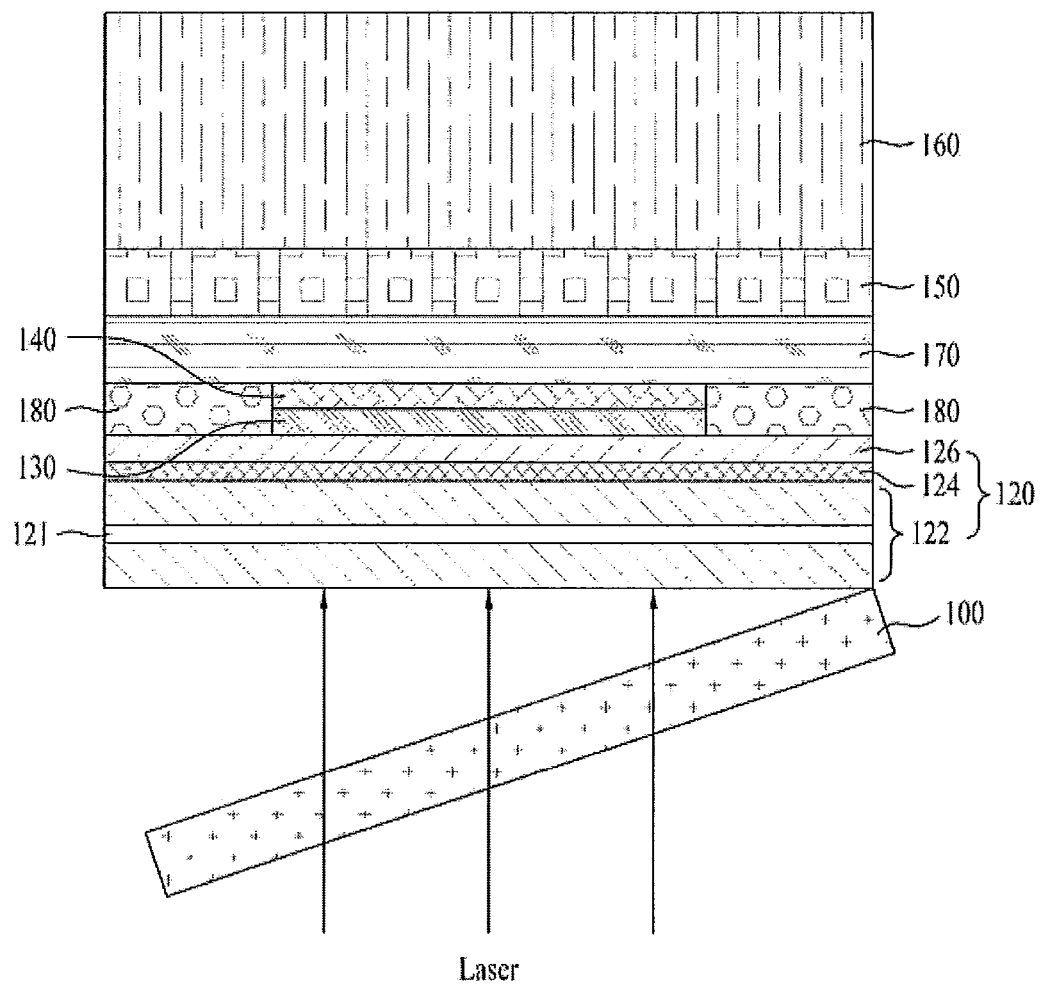

Subsequently, as shown in FIG. 5F, the substrate 100 is separated.

The substrate 100 may be removed by laser lift off using an excimer laser, dry etching or wet etching.

In the laser lift off, excimer laser light having a predetermined range of wavelengths is focused and irradiated upon the substrate 100 with the result that thermal energy is concentrated on the interface between the substrate 100 and the light emitting structure layer 120. Consequently, the interface is divided into gallium and nitrogen molecules, and therefore, the substrate 100 is instantaneously separated at the portion through which the laser light passes.

Figure 5G:
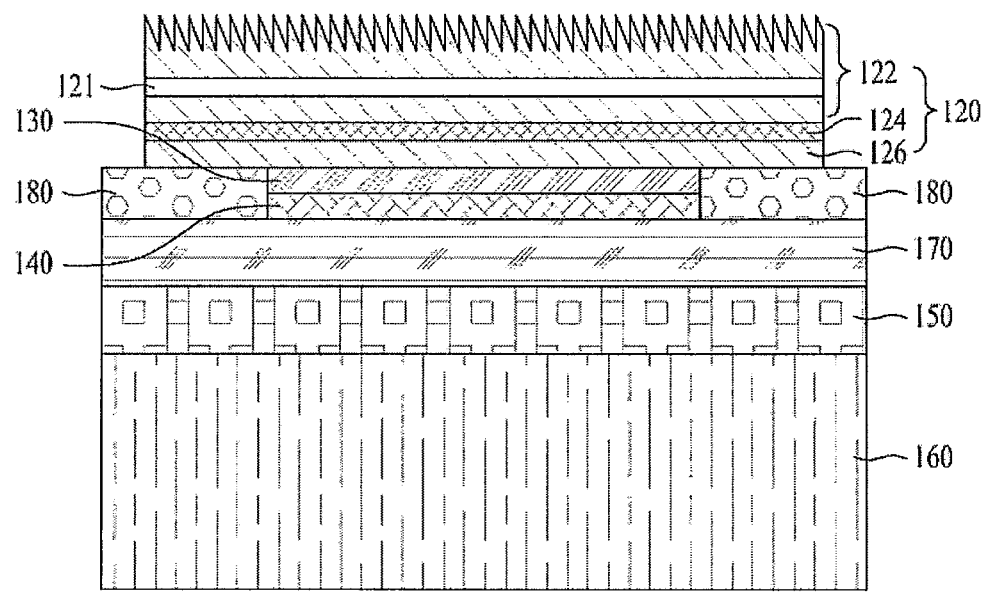

Subsequently, as shown in FIG. 5G, the lateral surface of the light emitting structure layer 120 is etched. At this time, when the material constituting the protective layer 180 is detected using an end point detection method, the etching may be stopped so that only a portion of the lateral surface of the light emitting structure layer 120 is etched.

At this time, an etched position may be adjusted so that the protective layer 180 is positioned under the etched light emitting structure layer 120.

The protective layer 180 protects the respective components disposed under the protective layer 180 and stably supports the light emitting device during etching of the light emitting structure layer 120, thereby preventing damage to the light emitting device caused during manufacture of the light emitting device.

Subsequently, as shown in FIG. 5G, an irregular portion is formed on the first conductive type semiconductor layer 122 to improve luminous extraction efficiency.

At this time, the irregular portion may be formed by dry etching, PEC or etching using a mask. Plasma etching, sputter etching or ion etching may be used as the dry etching.

For example, the irregular portion may be formed by dry etching using BCl or $Cl_2$. Dry etching may reduce the thickness of the first conductive type semiconductor layer 122 as compared with PEC.

The irregular portion varies an incidence angle of light emitted from the active layer 124 and incident upon the first conductive type semiconductor layer 122 to reduce total reflection at the surface of the first conductive type semiconductor layer 122, thereby improving luminous extraction efficiency, and to reduce absorption of the light emitted from the active layer 124 into the light emitting structure layer, thereby improving light emission efficiency.

According to embodiments, the irregular portion may be formed periodically or non-periodically. The shape of the irregular portion is not limited. For example, the irregular portion may be formed in single or complex shapes, such as a quadrangular shape, hemispherical shape, triangular shape, and trapezoidal shape.

The irregular portion may be formed by wet etching and/or dry etching.

Plasma etching, sputter etching or ion etching may be used as the dry etching. PEC may be used as the wet etching.

In PEC, etching speed difference based on the amount of an etching solution (for example, KOH) and crystallinity of GaN may be adjusted to adjust the shape of the irregular portion. Also, etching may be carried out after a mask is formed to periodically adjust the shape of the irregular portion.

Figure 5H:
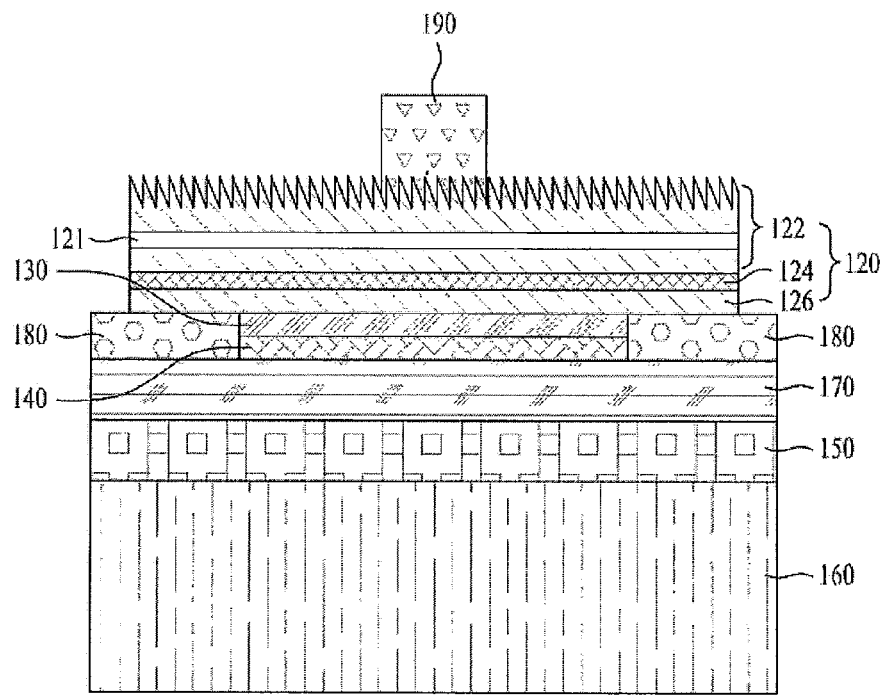

Subsequently, as shown in FIG. 5H, a first electrode 190 may be formed on the first conductive type semiconductor layer 122. The first electrode 190 may be formed of one selected from among molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy thereof.

According to embodiments, a passivation layer (not shown) may be at least partially deposited on the protective layer 180, the lateral surface of the light emitting structure layer 120, and the first electrode 190. The passivation layer may be formed of an insulative material, such as a nonconductive oxide or nitride. For example, the passivation layer may be formed of silicon oxide ($SiO_2$), silicon nitride or aluminum oxide.

Consequently, the light emitting device according to the above embodiment has the effect of improving light output efficiency.

Figure 6:
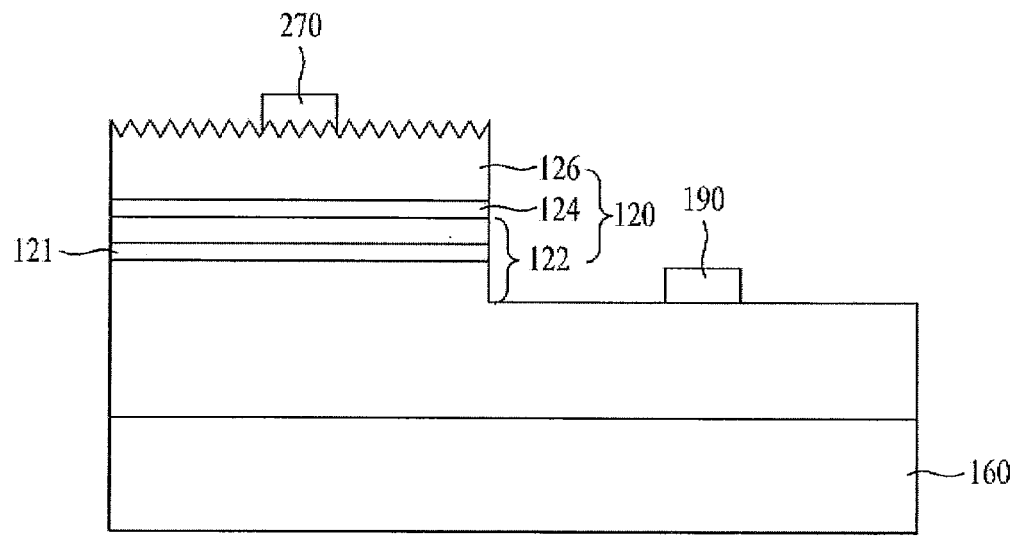
FIG. 6 is a sectional view showing a light emitting device according to another embodiment.

FIG. 6 is a sectional view showing a light emitting device according to another embodiment.

In FIG. 6, a main barrier layer 121 is applied to a horizontal type light emitting device. As shown in FIG. 6, the horizontal type light emitting device may include a support substrate 160, a light emitting structure layer 120 including a first conductive type semiconductor layer 122 having a main barrier layer 121, an active layer 124, and a second conductive type semiconductor layer 126, a first electrode 190, and a second electrode 270. The lateral surface of the light emitting structure layer 120 may be etched to expose the first conductive type semiconductor layer 122 so that the first electrode 190 is formed on the exposed first conductive type semiconductor layer 122. The other components have the same construction as those described previously.

Figure 7:
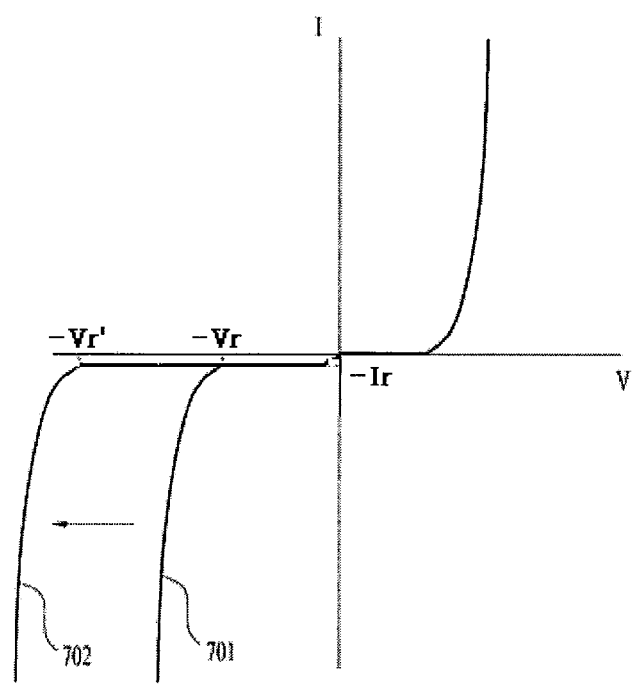
FIG. 7 is a view showing effects of the light emitting device according to an embodiment.

FIG. 7 is a view showing effects of the light emitting device according to an embodiment. The vertical axis indicates current (I) and the horizontal axis indicates voltage (V).

Referring to FIG. 7, the light emitting device has the effect of improving reverse voltage caused by current leakage while not greatly increasing operating voltage of the light emitting device.

Namely, it can be seen that reverse voltage $-V_r'$ 702 caused by leakage current $-I_r$ in the light emitting device according to this embodiment is improved as compared with reverse voltage $-V_r$ 701 caused by leakage current $-I_r$ in a conventional light emitting device. For example, when the leakage current $-I_r$ in the conventional light emitting device is $-10$ μA, the reverse voltage $-V_r$ 701 is $-10$ to $-35$ V. On the other hand, when the leakage current $-I_r$ in the light emitting device according to this embodiment is $-10$ μA, the reverse voltage $-V_r'$ 702 is $-15$ to $-50$ V. Consequently, it can be seen that the reverse voltage is improved by as much as 5 V to 15 V.

Figure 8:
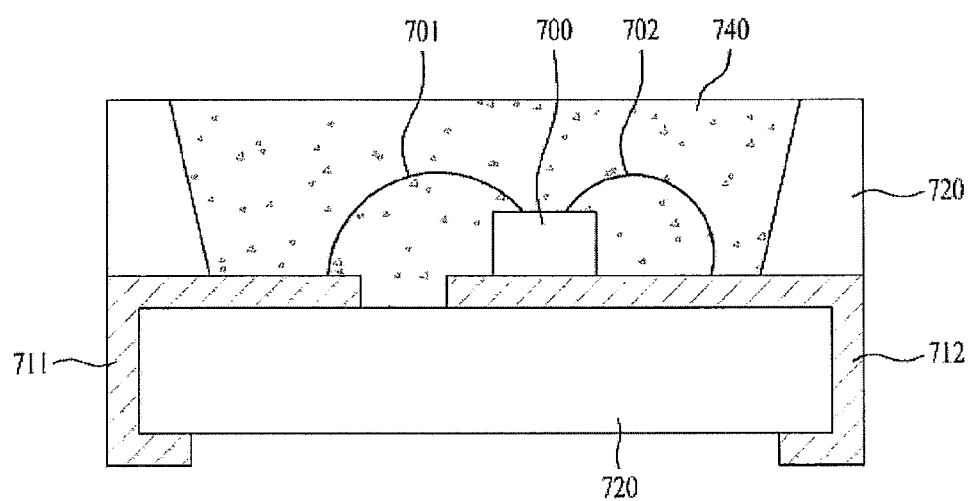
FIG. 8 is a view showing a light emitting device package according to an embodiment.

FIG. 8 is a view showing a light emitting device package according to an embodiment. As shown in FIG. 8, the light emitting device package includes a package body 720, a first electrode layer 711 and a second electrode layer 712 disposed at the package body 720, a light emitting device 700 disposed at the package body 720 so that the light emitting device 700 is electrically connected to the first electrode layer 711 and the second electrode layer 712, and a molding part 740 to surround the light emitting device 700. The light emitting device 700 corresponds to the previously described light emitting device; however, the light emitting device 700 is not limited thereto.

The package body 720 may be formed of a silicon material, synthetic material or metallic material. A slope may be formed in the vicinity of the light emitting device 700 to improve luminous extraction efficiency.

The first electrode layer 711 and the second electrode layer 712, electrically isolated from each other, provide power to the light emitting device 700. Also, the first electrode layer 711 and the second electrode layer 712 may reflect light emitted from the light emitting device 700, thereby improving luminous efficiency. In addition, the first electrode layer 711 and the second electrode layer 712 may function to dissipate heat from the light emitting device 700 outward.

The light emitting device 700 may be disposed on the package body 720 or at the upper surface of the first electrode layer 711 and/or the second electrode layer 712.

The light emitting device 700 may be electrically connected to the first electrode layer 711 and the second electrode layer 712 using a wiring method, flip chip method or die bonding method.

The light emitting device package may include one or more light emitting devices according to one of the previous embodiments; however, the light emitting device package is not limited thereto.

In this embodiment, a plurality of light emitting device packages may be arranged on a board. As an optical member, a light guide plate, a prism sheet, or a diffusion sheet may be disposed on an optical path of the light emitting device package. The light emitting device package, the substrate, and the optical member may function as a light unit. In other embodiments, a display apparatus, indication apparatus, and lighting system including the light emitting device or the light emitting device package according to one of the previous embodiments may be realized. For example, the lighting system may include a lamp and a streetlight.

Figure 9:
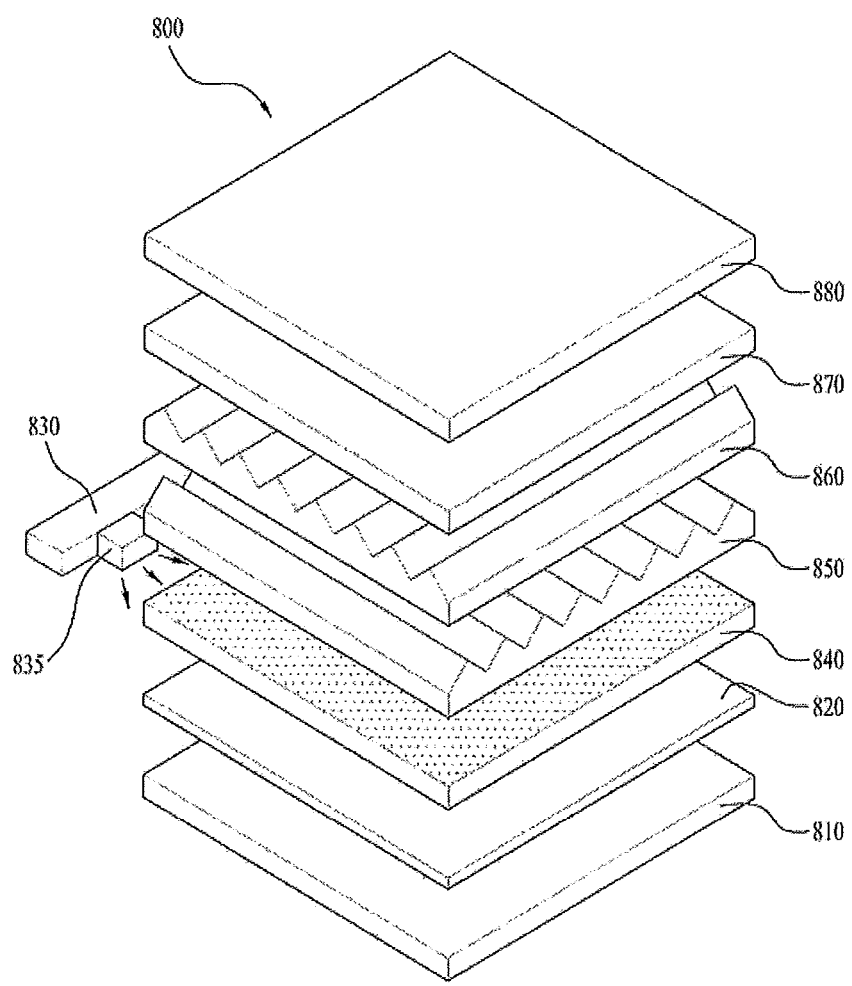
FIG. 9 is a view showing a display apparatus including a light emitting device according to an embodiment.

FIG. 9 is a view showing a display apparatus 800 including a light emitting device according to an embodiment.

As shown in FIG. 9, the display apparatus 800 includes a light emitting module 830 and 835, a reflective plate 820 disposed on a bottom cover 810, a light guide plate 840 disposed in front of the reflective plate 820 to guide light emitted from the light emitting module to the front of the display apparatus, a first prism sheet 850 and a second prism sheet 860 disposed in front of the light guide plate 840, a panel 870 disposed in front of the second prism sheet 860, and a color filter 880 disposed in front of the panel 870.

The light emitting module includes a light emitting device package 835 disposed on a board 830. Components of the display apparatus 800 may be disposed in the bottom cover 810. Although the reflective plate 820 is provided as a separate component as shown in the drawing, the rear of the light guide plate 840 or the front of the bottom cover 810 may be coated with a material exhibiting high reflectance to form the reflective plate 820.

The reflective plate 820 may be formed of a material that exhibits high reflectance and can be formed in a very thin shape. For example, the reflective plate 820 may be formed of polyethylene terephthalate (PET).

The light guide plate 840 scatters light emitted from the light emitting module so that the light can be uniformly distributed over a screen of the liquid crystal display apparatus. To this end, the light guide plate 840 is formed of a material exhibiting a high refractive index and transmissivity. For example, the light guide plate 840 may be formed of polymethylmethacrylate (PMMA), polycarbonate (PC) or polyethylene (PE).

Alternatively, the light guide plate 840 may be omitted to provide an air guide system in which light is transferred via a space between the reflective plate 820 and the first prism sheet 850.

The first prism sheet 850 may be formed by attaching an elastic polymer material exhibiting light transmission to one surface of a support film. The polymer may have a prism layer in which a plurality of three-dimensional patterns is repeatedly formed. As shown, the patterns may be formed in a striped pattern including alternately arranged ridges and valleys.

The extension direction of the ridges and valleys formed at one surface of the support film of the second prism sheet 860 may be perpendicular to the extension direction of the ridges and valleys formed at one surface of the support film of the first prism sheet 850. As a result, light transmitted from the light source module and the reflective sheet is uniformly distributed to the front of the display panel 870.

Although not shown, a protective sheet may be provided on each of the prism sheets. Protective layers, each of which includes light diffusion particles and a binder, may be disposed at opposite surfaces of the support film.

Also, the prism layer may be formed of a polymer material selected from a group consisting of polyurethane, styrene butadiene polymer, polyacrylate, polymethacrylate, polymethylmethacrylate, polyethylene terephthalate elastomer, polyisoprene and polysilicon.

Although not shown, a diffusion sheet may be disposed between the light guide plate 840 and the first prism sheet 850. The diffusion sheet may be formed of polyester-based or polycarbonate-based material. The diffusion sheet may refract and scatter light emitted from the backlight unit to maximize a light incidence angle.

The diffusion sheet may include a support layer containing a light dispersing agent, and a first layer and a second layer, not containing a light dispersing agent, formed at a light emission surface (toward the first prism sheet) and a light incidence surface (toward the reflective sheet).

The support layer may contain 0.1 to 10 weight percent of a siloxane-based light dispersing agent having an average particle size of 1 µm to 10 µm and 0.1 to 10 weight percent of an acryl-based light dispersing agent having an average particle size of 1 µm to 10 µm with respect to 100 weight percent of a resin composed of a mixture of methacrylate-styrene polymer and methyl methacrylate-styrene polymer.

The first layer and the second layer may contain 0.01 to 1 weight percent of an ultraviolet absorbent and 0.001 to 10 weight percent of an antistatic agent with respect to 100 weight percent of methyl methacrylate-styrene polymer.

In the diffusion sheet, the thickness of the support layer may be 100 µm to 10000 µm, and the thickness of each of the layers may be 10 µm to 1000 µm.

In this embodiment, the diffusion sheet, the first prism sheet 850 and the second prism sheet 860 constitute an optical sheet. Alternatively, the optical sheet may be constituted by other combinations, such as a micro lens array, a combination of the diffusion sheet and the micro lens array, or a combination of one of the prism sheets and the micro lens array.

A liquid crystal display panel may be used as the display panel 870. Alternatively, other kinds of display apparatuses requiring a light source may be provided in addition to the liquid crystal display panel 860.

The panel 870 is configured so that a liquid crystal is disposed between glass bodies, and polarizing plates are disposed on the respective glass bodies to use polarization of light. A liquid crystal has properties between those of liquid and those of a solid. A liquid crystal, which is composed of organic molecules exhibiting fluidity like liquid, is regularly arranged like a crystal. The liquid crystal displays an image using a property in that the arrangement of the molecules is changed by an external electric field.

The liquid crystal display panel used in the display apparatus is of an active matrix type in which a transistor is used as a switch to adjust voltage supplied to each pixel.

The color filter 880 is provided at the front of the panel 870 so that red, green and blue light components of the light emitted from the panel 870 are transmitted through the respective pixels to display an image.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a light emitting structure layer, wherein the light emitting structure layer comprises:
      an active layer comprising a quantum barrier and a quantum well;
      a first conductive type semiconductor layer disposed at one side of the active layer;
      a second conductive type semiconductor layer disposed at the other side of the active layer; and
      a main barrier layer, and
   wherein the main barrier layer comprises:
      a plurality of sub barrier layers; and
      a basal layer disposed between the plurality of sub barrier layers, the plurality of sub barrier layers comprising:
         a first section in which an energy band gap of each sub barrier layer is greater than an energy band gap of an immediately preceding sub barrier layer; and
         a second section in which an energy band gap of each sub barrier layer is less than an energy band gap of an immediately preceding sub barrier layer.

2. The light emitting device according to claim 1, wherein each of the plurality of sub barrier layers comprises a material having an energy band gap greater than that of a material for the first or second conductive type semiconductor layer.

3. The light emitting device according to claim 1, wherein the basal layer comprises a material having an energy band gap equal to that of a material for the first or second conductive type semiconductor layer.

4. The light emitting device according to claim 1, wherein the basal layer comprises a material having an energy band gap less than that of a material for the first or second conductive type semiconductor layer.

5. The light emitting device according to claim 1, wherein the main barrier layer is disposed in the active layer.

6. The light emitting device according to claim 1, wherein the main barrier layer is disposed between the first conductive type semiconductor layer and the active layer.

7. The light emitting device according to claim 1, wherein the main barrier layer is disposed between the active layer and the second conductive type semiconductor layer.

8. The light emitting device according to claim 1, wherein each of the plurality of sub barrier layers has a thickness of 0.1 nm to 100 nm.

9. The light emitting device according to claim 1, wherein the basal layer of the main barrier layer has a thickness of 0.1 nm to 100 nm.

10. The light emitting device according to claim 1, wherein the basal layer comprises a plurality of basal layers, and the plurality of sub barrier layers and the plurality of basal layers are disposed in pairs.

11. The light emitting device according to claim 10, wherein the number of the pairs is 40 or less.

12. The light emitting device according to claim 10, wherein the barrier layer/basal layer pairs includes at least one selected from among AlGaN/GaN, InAlGaN/GaN, AlGaAs/GaAs (InGaAs) and AlGaP/GaP (InGaP).

13. The light emitting device according to claim 10, wherein the barrier layer/basal layer pairs are formed of AlGaN/GaN, and each of the plurality of sub barrier layers has a compositional formula of $Al_{x1}Ga_{(1-x1)}N$ ($0 \leq x1 \leq 0.3$).

14. The light emitting device according to claim 13, wherein the plurality of sub barrier layers in the first or second section has different concentrations of Al.

15. The light emitting device according to claim 1, wherein the energy band gaps of the plurality of sub barrier layers in the first section are increased stepwise, and the energy band gaps of the plurality of sub barrier layers in the second section are decreased stepwise.

16. The light emitting device according to claim 1, wherein the main barrier layer comprises a superlattice structure.

17. The light emitting device according to claim 1, further comprising an electron blocking layer between the active layer and the first conductive type semiconductor layer or the second conductive type semiconductor layer.

18. The light emitting device according to claim 1, wherein the energy band gap of each of the plurality of sub barrier layers is greater than that of the quantum barrier.

19. A light emitting device package, comprising:
a package body;
a first and second electrode disposed on the package body, the first and second electrodes being electrically isolated from each other;
a light emitting device disposed at an upper surface of at least one selected from among the package body, the first electrode and the second electrode, the light emitting device being electrically connected to the first electrode layer and the second electrode layer; and
a molding member disposed on the package body to surround the light emitting device,
wherein the light emitting device comprises:
an active layer comprising a quantum barrier and a quantum well;
a first conductive type semiconductor layer disposed at one side of the active layer; and
a second conductive type semiconductor layer disposed at the other side of the active layer,
wherein the first conductive type semiconductor layer or the second conductive type semiconductor layer comprises a main barrier layer, and
wherein the main barrier layer comprises:
a plurality of sub barrier layers; and
a basal layer disposed between the plurality of sub barrier layers, the plurality of sub barrier layers comprising a first section in which energy band gaps of the plurality of sub barrier layers are increased and a second section in which energy band gaps of the plurality of sub barrier layers are decreased.

20. A lighting system comprising a light emitting device package, wherein the light emitting device package comprises:
a package body;
a first and second electrode disposed on the package body, the first and second electrodes being electrically isolated from each other;
a light emitting device disposed at an upper surface of at least one selected from among the package body, the first electrode and the second electrode, the light emitting device being electrically connected to the first electrode layer and the second electrode layer; and
a molding member disposed on the package body to surround the light emitting device,
wherein the light emitting device comprises:
an active layer comprising a quantum barrier and a quantum well;
a first conductive type semiconductor layer disposed at one side of the active layer; and
a second conductive type semiconductor layer disposed at the other side of the active layer,
wherein the first conductive type semiconductor layer or the second conductive type semiconductor layer comprises a main barrier layer, and
wherein the main barrier layer comprises:
a plurality of sub barrier layers; and
a basal layer disposed between the plurality of sub barrier layers, the plurality of sub barrier layers comprising a first section in which energy band gaps of the plurality of sub barrier layers are increased and a second section in which energy band gaps of the plurality of sub barrier layers are decreased.

21. The light emitting device according to claim 1, wherein the main barrier layer is disposed in the first conductive type semiconductor layer or the second conductive type semiconductor layer.

* * * * *